(12) United States Patent
Sihler et al.

(10) Patent No.: US 9,611,855 B2
(45) Date of Patent: Apr. 4, 2017

(54) METHODS AND SYSTEMS FOR DIRECT CURRENT POWER SYSTEM SUBSEA BOOSTING

(71) Applicant: General Electric Company, Schenectady, NY (US)

(72) Inventors: Christof Martin Sihler, Bavaria (DE); Manoj Ramprasad Shah, Latham, NY (US); Siddharth Navinchandra Ashar, Bavaria (DE); Simon Herbert Schramm, Bavaria (DE); Svend Erik Rocke, Lier (NO); Vittorio Michelassi, Bavaria (DE)

(73) Assignee: General Electric Company, Schenectady, NY (US)

( * ) Notice: Subject to any disclaimer, the term of this patent is extended or adjusted under 35 U.S.C. 154(b) by 386 days.

(21) Appl. No.: 14/142,113

(22) Filed: Dec. 27, 2013

(65) Prior Publication Data

US 2015/0184658 A1    Jul. 2, 2015

(51) Int. Cl.
| | |
|---|---|
| F04D 13/06 | (2006.01) |
| F04D 13/12 | (2006.01) |
| H05K 7/14 | (2006.01) |
| E21B 41/00 | (2006.01) |
| F04D 15/00 | (2006.01) |

(Continued)

(52) U.S. Cl.
CPC .......... *F04D 13/06* (2013.01); *E21B 41/0007* (2013.01); *E21B 43/01* (2013.01); *F04D 13/12* (2013.01); *F04D 15/0066* (2013.01); *H02J 1/00* (2013.01); *H02K 15/00* (2013.01); *H02P 27/06* (2013.01); *H05K 7/1432* (2013.01);

*H02J 3/36* (2013.01); *Y02E 60/60* (2013.01); *Y10T 29/49009* (2015.01)

(58) Field of Classification Search
CPC ...... F04D 13/06; F04D 13/12; F04D 15/0066; H05K 7/1432; H02K 15/00; H02J 1/00; H02J 3/36; H02P 27/06; E21B 43/01; E21B 41/0007; Y10T 29/49009
USPC ................................... 417/410.1, 411, 423.3
See application file for complete search history.

(56) References Cited

U.S. PATENT DOCUMENTS 5,820,354 A * 10/1998 Wild .................... F04C 11/001
                                                                    417/244
7,817,422 B2    10/2010 Gunturi et al.
(Continued)

FOREIGN PATENT DOCUMENTS

| EP | 2487327 A1 | 8/2012 |
|---|---|---|
| EP | 2501212 A1 | 9/2012 |

(Continued)

OTHER PUBLICATIONS

U.S. Appl. No. 13/600,556, filed Aug. 31, 2012.
(Continued)

*Primary Examiner* — William H Rodriguez
*Assistant Examiner* — Christopher Brunjes
(74) *Attorney, Agent, or Firm* — Armstrong Teasdale LLP

(57) ABSTRACT

A subsea boosting module for use with a direct current (DC) power system includes a housing defining at least one interior chamber. A fluid pump is disposed within the interior chamber. An electric motor is disposed within the interior chamber and drivingly coupled to the fluid pump. A plurality of power components is disposed within the interior chamber to deliver power to the electric motor.

14 Claims, 6 Drawing Sheets

(51) Int. Cl.
*H02J 1/00* (2006.01)
*H02K 15/00* (2006.01)
*H02P 27/06* (2006.01)
*E21B 43/01* (2006.01)
*H02J 3/36* (2006.01)

(56) References Cited

U.S. PATENT DOCUMENTS

| | | |
|---|---|---|
| 7,851,943 B2 | 12/2010 | Datta et al. |
| 7,880,419 B2 | 2/2011 | Sihler et al. |
| 8,373,307 B2 | 2/2013 | Sihler et al. |
| 2003/0153468 A1 | 8/2003 | Soelvik |
| 2009/0296433 A1 | 12/2009 | Sihler et al. |
| 2010/0038774 A1 | 2/2010 | Zhang et al. |
| 2010/0119382 A1* | 5/2010 | Scarsdale ............... F04B 35/04 417/53 |
| 2010/0133901 A1 | 6/2010 | Zhang et al. |
| 2011/0300008 A1* | 12/2011 | Fielder ................ E21B 19/002 417/410.3 |
| 2012/0217802 A1* | 8/2012 | Kanakasabai ............ H02J 3/36 307/32 |
| 2013/0026831 A1 | 1/2013 | Sihler et al. |
| 2013/0032314 A1* | 2/2013 | Baerd ................ H05K 7/20272 165/104.33 |
| 2013/0043035 A1* | 2/2013 | Hale ..................... E21B 43/017 166/338 |
| 2013/0258733 A1 | 10/2013 | Zhang et al. |

FOREIGN PATENT DOCUMENTS

| | | | |
|---|---|---|---|
| GB | 1305990 A | 2/1973 | |
| GB | 1306469 A | 2/1973 | |
| NO | WO 2012141599 A1 * | 10/2012 | ............... F28D 7/06 |
| WO | 2004111389 A1 | 12/2004 | |

OTHER PUBLICATIONS

U.S. Appl. No. 13/478,310, filed May 23, 2012.
U.S. Appl. No. 13/946,408, filed Jul. 19, 2013.
European Search Report and Opinion issued in connection with corresponding EP Application No. 14199485.5 on Jun. 1, 2015.

\* cited by examiner

METHODS AND SYSTEMS FOR DIRECT CURRENT POWER SYSTEM SUBSEA BOOSTING

BACKGROUND

This description relates to subsea boosting, more particularly, to systems and methods for subsea boosting in a high-voltage direct current (HVDC) transmission and distribution system.

As oil and gas fields in shallow waters diminish, producers are tapping offshore fields in deeper waters with oil installations that operate far below the surface of the sea. The typical equipment for such subsea oil recovery and production include gas compressors and various pumps for multiple functions. Electric variable speed drive (VSD) and motor systems are one way to power such equipment directly under the deep water. Therefore, the delivery of electric power from a remote onshore utility grid or power generation is important to secure a reliable production and processing of oil and gas in subsea locations. Typically, the transmission power requirement is up to several hundred megawatts for medium to large oil/gas fields.

Alternating current (AC) transmission and distribution systems are sometimes used for delivery of power to subsea locations. Such systems typically deliver AC power from a platform or terrestrial location to a large subsea transformer through a large power cable. Power is transferred from the subsea transformer to subsea AC switchgear through another power cable. The subsea AC switchgear feeds AC power to one or more subsea VSDs via yet another cable. The VSDs each provide variable AC power to electric motors via a power cable. The connections between components in subsea AC distribution systems typically require wet mateable connectors, which are significantly more expensive than dry mateable connectors. In addition, the size of components in subsea boosting systems has generally increased over time. Some known systems utilize three to five megavolt-ampere (MVA) pumps, each of which may weigh more than ten tons. Other components in known subsea boosting systems and/or AC transmission and distribution systems are also very large and/or heavy. Moreover AC transmission and distribution systems face technical challenges, which become more significant when transmission distance is in excess of fifty kilometers. For example, the significant reactive power drawn from the distributed subsea cable capacitors constrains the power delivery capability as well as increases the system cost.

BRIEF DESCRIPTION

In one embodiment, a subsea boosting module for use with a direct current (DC) power system includes a housing defining at least one interior chamber. A fluid pump is disposed within the interior chamber. An electric motor is disposed within the interior chamber and drivingly coupled to the fluid pump. A plurality of power components is disposed within the interior chamber to deliver power to the electric motor.

In another embodiment, a subsea boosting system for use with a direct current (DC) power system includes a plurality of subsea boosting modules. Each subsea boosting module includes a fluid pump, an electric motor drivingly coupled to the fluid pump, and a plurality of power components configured to deliver power to the electric motor. The plurality of subsea boosting modules are electrically coupled together in series. The fluid pumps of the plurality of subsea modules are coupled together in fluid communication.

In yet another embodiment, a method of producing a subsea boosting system for use with a direct current (DC) power system is described. The subsea boosting system has a first power rating. The method includes electrically coupling together a plurality of subsea boosting modules, each of which includes a fluid pump, an electric motor, and a plurality of power components. The subsea boosting modules each have a second power rating less than the first power rating. The method includes coupling together in fluid communication the fluid pumps of the subsea boosting modules.

DRAWINGS

These and other features, aspects, and advantages of the present disclosure will become better understood when the following detailed description is read with reference to the accompanying drawings in which like characters represent like parts throughout the drawings, wherein.

Figure 1:
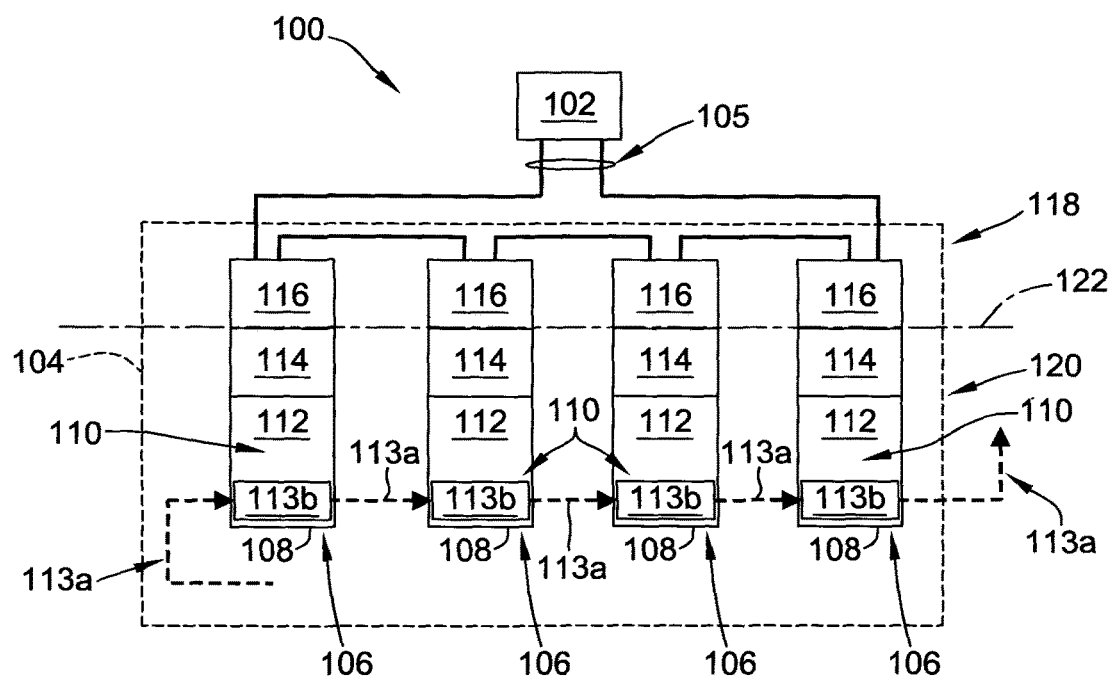
FIG. 1 is a schematic block diagram of subsea boosting system powered by a direct current (DC) power source.

Unless otherwise indicated, the drawings provided herein are meant to illustrate features of embodiments of the disclosure. These features are believed to be applicable in a wide variety of systems comprising one or more embodiments of the disclosure. As such, the drawings are not meant to include all conventional features known by those of ordinary skill in the art to be required for the practice of the embodiments disclosed herein.

DETAILED DESCRIPTION

In the following specification and the claims, reference will be made to a number of terms, which shall be defined to have the following meanings.

The singular forms "a", "an", and "the" include plural references unless the context clearly dictates otherwise.

"Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise.

Embodiments of the present disclosure relate to subsea boosting and systems and methods for subsea boosting in a high-voltage direct current (HVDC) transmission and distribution system. More particularly, embodiments of this disclosure relate to a modular, vertically integrated system architecture for subsea boosting, in which one or more subsea modules are combined to form a subsea boosting system. Each of the subsea modules integrates a motor, pump and electronic power components into a single module. The subsea modules are compartmentalized pressure vessels, with each compartment being assembled to the module as its equipment is installed. The vessel shape is conducive to handling different pressures in different compartments, while limiting the cross section of the module. Some exemplary embodiments substantially minimize the number of power penetrators utilized in the subsea boosting module, resulting in higher reliability and lower costs. The modular approach allows subsea boosting systems to be built to match a desired system power, as well as maintaining partial availability to reduce system down-time. The subsea boosting modules generally have a lower size and mass per module than the large components of a non-modularized system.

The following description refers to the accompanying drawings, in which, in the absence of a contrary representation, the same numbers in different drawings represent similar elements.

FIG. 1 is a schematic block diagram of subsea boosting system 100 powered by a direct current (DC) power source 102. In the exemplary embodiment, DC power source 102 is a platform based alternating current (AC) to DC power converter that converts AC power from an AC power source, e.g., without limitation, an AC power grid, to DC power. In other embodiments, DC power source 102 may be a land based DC power source, a DC power generator (land or platform based), or any other suitable DC power source. DC power source 102 is a high voltage DC power source. In the exemplary embodiment, DC power source 102 provides several tens of kilovolt (kV) DC output. In an embodiment, DC power source 102 provides a thirty kV DC output. In other embodiments, DC power source provides any other suitable high voltage DC output that enables operation of subsea boosting system 100 as described herein.

A subsea boosting assembly 104 is electrically coupled to and receives DC power from DC power source 102 via a two wire umbilical cable 105. Subsea boosting assembly 104 includes multiple subsea boosting modules 106 electrically coupled together, mechanically coupled together, and coupled together in fluid communication with each other. Subsea boosting modules 106 are mechanically coupled together by attachment to each other directly or indirectly using, for example, welding, fasteners, straps, or any other suitable mechanical connection. In the illustrated embodiment, assembly 104 includes four subsea boosting modules 106. In other embodiments, assembly 104 may include more or fewer (including one) subsea boosting modules 106. The number of subsea boosting modules 106 is generally selected to provide an assembly 104 with the desired pumping power. Thus, each module 106 may be a smaller size than desired total pumping power. For example, rather than utilizing a single, large six MVA pump, three smaller subsea boosting modules 106, each rated at two MVA, may be utilized.

Each subsea boosting module 106 includes a housing 108 defining an interior 110. A fluid pump 112 is disposed within interior 110 of housing 108. An electric motor 114 is disposed within interior 110 of housing 108 and is coupled to fluid pump 112 to drive fluid pump 112. Fluid pump 112 and electric motor 114 may be any suitable fluid pump and motor for driving the selected fluid pump. The combination of electric motor 114 and fluid pump 112 will have a smaller power rating (in, e.g., MVA) than the complete subsea boosting system 100 and a comparable single pump boosting system.

Power components 116 are disposed within interior 110 of housing 108 to provide power to electric motor 114. Power components 116 generally include all components needed to power electric motor 114 to drive fluid pump 112 from the DC power received from source 102. In some embodiments, power components 116 include one or more DC to AC (DC/AC) power converters (not shown in FIG. 1). The DC/AC power converters may be any suitable isolated or non-isolated DC/AC power converters. Moreover, the DC/AC power converters may each include any suitable number of converter stages. For example, a DC/AC power converter may be a single stage DC/AC converter. Alternatively, a DC/AC power converter may include one or more DC to DC power converter stages, followed by a DC/AC converter stage. In some embodiments, power components 116 include one or more transformers (not shown in FIG. 1) for isolating a DC side 118 of system 100 from an AC side 120 of system 100 (separated in FIG. 1 by an isolation line 122). The transformers may be separate transformers and/or may be a part of one or more stages of the DC/AC power converter.

Subsea boosting modules 106 are electrically coupled together in series. One wire of umbilical cable 105 is connected to the first subsea boosting module 106 in the series, while the second wire of umbilical cable 105 is connected to the last subsea boosting module 106 in the series.

Various additional components and/or systems (not shown in FIG. 1) may be included in some embodiments of subsea boosting modules 106. For example, subsea boosting modules 106 may include a bypass module coupled between the DC power input and power components 116. The bypass module permits selective bypassing of the subsea boosting module 106 by electrically disconnecting it from DC power source 102 and the other subsea boosting modules 106, e.g., in response to a received instruction, in response to a detected condition etc. Moreover, in some embodiments, the bypass module permits selective coupling of one or more components of the power components 116 to DC power source 102 and/or other subsea boosting modules 106. Some embodiments include one or more cooling systems within housing 108 of subsea boosting modules 106. Cooling systems may include active and/or passive cooling systems used to cool fluid pump 112, electric motor 114, and/or power components 116. In some embodiments, active cooling systems include one or more cooling pumps powered by electric motor 114.

In some embodiments, housing 108 of subsea boosting module 106 defines two or more interior chambers (not shown in FIG. 1). Fluid pump 112 and electric motor 114 are disposed in one chamber of subsea boosting module 106, while power components 116 and additional components are disposed in one or more other chambers of subsea boosting module. In another example embodiment, fluid pump 112 and electric motor 114 are disposed in a chamber of subsea boosting module 106 that is configured to maintain substantially the same pressure within the chamber as the ambient pressure outside housing 108. Power components 116 are disposed in a different chamber of subsea boosting module 106 that is configured to maintain a substantially constant pressure within the chamber without regard to the ambient pressure outside housing 108. In a particular embodiment, power components 116 are disposed in a chamber of subsea boosting module 106 that is configured to maintain a substantially constant pressure of one atmosphere within the chamber. Additional components may be housed within the same chamber as power components 116 or in a different chamber, which may maintain a constant pressure or maintain a pressure the same as the ambient pressure around housing 108.

Fluid pumps 112 of subsea boosting modules 106 may be coupled together in fluid communication with each other in series (e.g., a series flow path 113a) or in parallel. When coupled together in series, bypass valves 113b and/or recirculation valves may be used to permit selective bypassing of selected subsea boosting module(s) 106, e.g., without limitation, when one subsea boosting module 106 is blocked and/or has a fault.

FIGS. 2-7 are cross sectional views of exemplary embodiments of subsea boosting modules for use as subsea boosting modules 106 in system 100 (shown in FIG. 1). Similar components in FIGS. 2-7 are identified with the same reference numbers.

Figure 2:
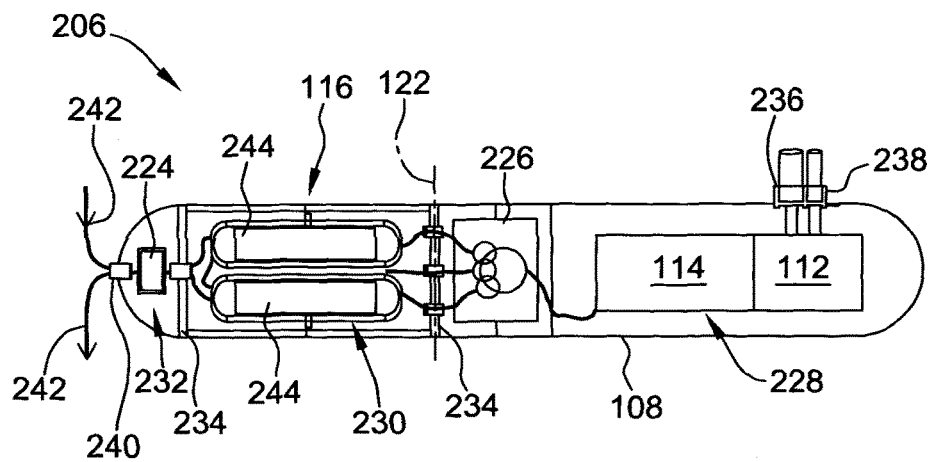
FIG. 2 is a cross-sectional view of an exemplary subsea boosting module for use in the system shown in FIG. 1.

FIG. 2 is a cross-sectional view of an exemplary subsea boosting module 206 for use in the system 100. Subsea boosting module 206, shown in FIG. 2, includes a bypass module 224, power components 116, a transformer 226, electric motor 114, and fluid pump 112.

Housing 108 defines three chambers 228, 230, and 232 separated by dividers 234, which may also be referred to as bulkheads. Chambers 228 and 232 are configured to maintain substantially the same pressure as the ambient pressure outside of housing 108, while chamber 230 is configured to maintain a substantially constant pressure (e.g., about 101.325 kilopascals) regardless of the ambient pressure outside housing 108. A fluid inlet 236 and a fluid outlet 238 are coupled to housing 108 to permit fluid communication to fluid pump 112.

Interface 240 (which may also be referred to as an input) couples DC power from DC power source 102 (shown in FIG. 1) to subsea boosting module 206 (and more specifically to bypass module 224). Subsea boosting module 206 may also be coupled in series with other subsea boosting modules 206 via interface 240. Thus wires 242 may be wires interconnecting subsea boosting module 206 with other subsea boosting modules 206, and/or may be one or both wires from umbilical cable 105 (shown in FIG. 1). Interface 240 is configured for a wet mateable connection, i.e., it includes a wet mateable connector, with wires 242.

In subsea boosting module 206, power components 116 include three power converters 244 (one of which is not shown). The exemplary power converters 244 are non-isolated DC/AC converters. Power converters 244 are configured to receive DC power from source 102 through interface 240 and bypass module 224, and to output AC power to motor 114 through transformer 226. In the exemplary embodiment, all three power converters 244 are needed to provide the desired power output for operation of electric motor 114. In other embodiments a single power converter 244 or two power converters 244 may be sufficient to power electric motor 114, and the second and/or third power converter 244 may be one or more redundant power converters 244.

Figure 3:
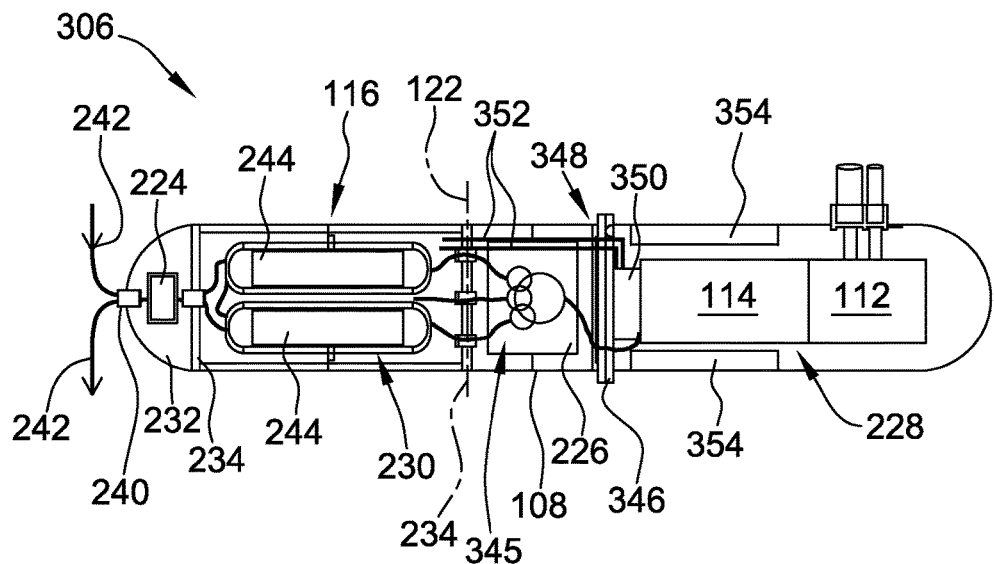
FIG. 3 is a cross-sectional view of an alternative subsea boosting module for use in the system shown in FIG. 1.

FIG. 3 is a cross-sectional view of an alternative subsea boosting module 306 for use in system 100 (shown in FIG. 1). In this embodiment, housing 108 defines an additional chamber 345 in which transformer 226 is disposed. Subsea boosting module 306 includes a flange 346. Flange 346 separates chamber 228 from chamber 345. In some embodiments, one or more of dividers 234 are used in lieu of flanges 346. Alternatively, one or more flanges 346 are used in lieu of dividers 234.

Subsea boosting module 306 includes a cooling system 348 for cooling power converters 244 and electric motor 114. Cooling system 348 includes a pump 350 for pumping coolant through cooling system 348. Pump 350 is rotatably coupled to and powered by electric motor 114. Cooling system 348 pumps coolant through coolant pipes 352 to power converters 244, and pumps coolant through coiled tubes 354 for external cooling of electric motor 114. In other embodiments, motor 114 and power components 116 may be cooled using separate cooling systems 348. Moreover, some embodiments may include additional cooling components. For example, additional external coils may be added around power converters 244 to provide additional external cooling.

Figure 4:
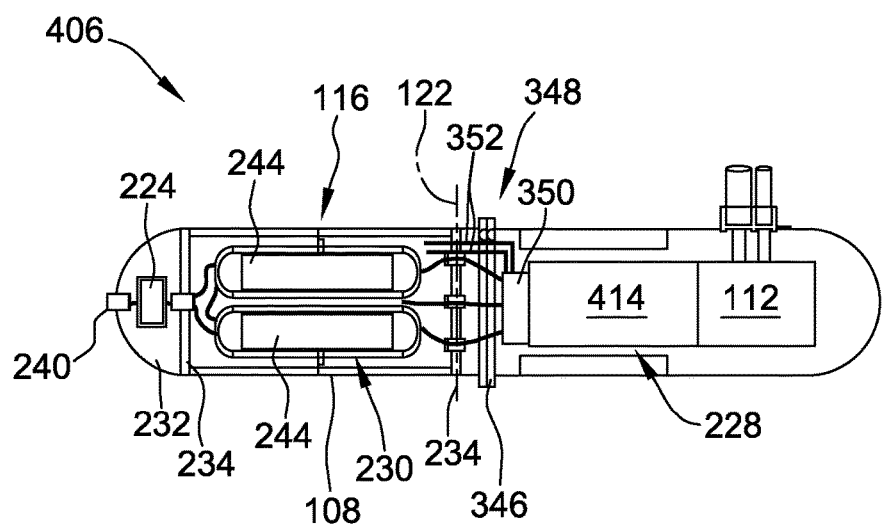
FIG. 4 is a cross-sectional view of a another alternative subsea boosting module for use in the system shown in FIG. 1.

FIG. 4 is a cross-sectional view of another alternative subsea boosting module 406 for use in system 100 (shown in FIG. 1). In this embodiment, motor 114 is replaced with an electric motor 414 that includes sufficiently rated electrical insulation for high voltage to ground such that a transformer is not needed.

Figure 5:
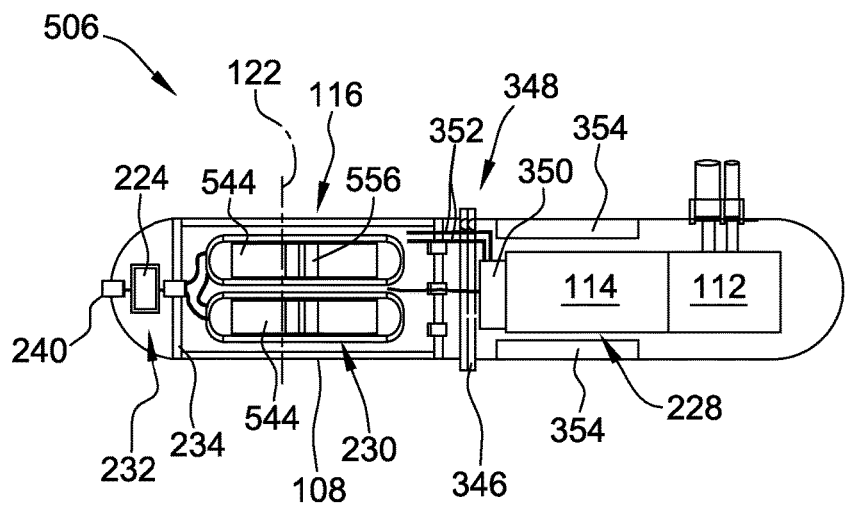
FIG. 5 is a cross-sectional view of yet another alternative subsea boosting module for use in the system shown in FIG. 1.

FIG. 5 is a cross-sectional view of yet another alternative subsea boosting module 506 for use in system 100 (shown in FIG. 1). In subsea boosting module 506, power converters 244 are replaced with power converters 544. Power converters 544 are isolated power converters that include integrated transformers 556. Thus, a separate transformer is not utilized.

Figure 6:
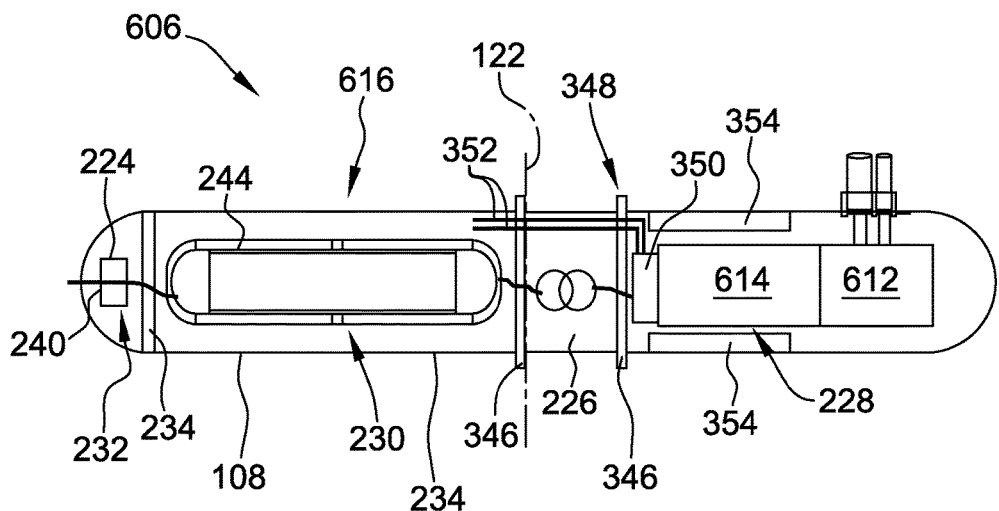
FIG. 6 is a cross-sectional view of a further alternative subsea boosting module for use in the system shown in FIG. 1.

FIG. 6 is a cross-sectional view of another alternative subsea boosting module 606 for use in system 100 (shown in FIG. 1). Subsea boosting module 606 is smaller than subsea boosting modules 206, 306, 406, and 506. Subsea boosting module 606 includes power components 616, electric motor 614 and fluid pump 612. Power components 616 include a single power converter 244. Electric motor 614 and fluid pump 612 are rated for a lower power than electric motor 114 and fluid pump 112 in subsea boosting modules 206, 306, 406, and 506, but are otherwise similar. Because motor 614 and pump 612 require less power, only a single power converter 244 is needed to power electric motor 114 in subsea boosting module 606.

Figure 7:
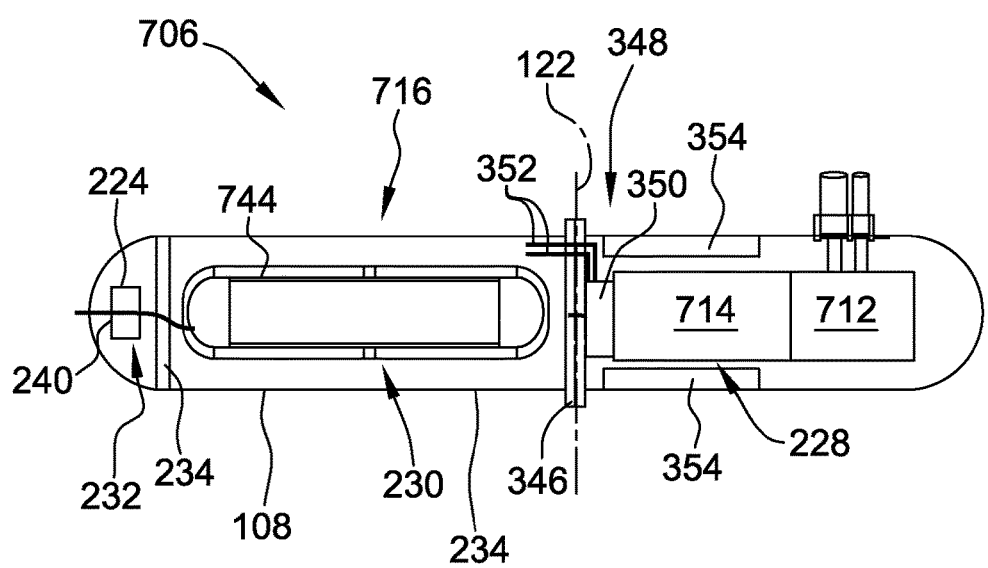
FIG. 7 is a cross-sectional view of a yet another alternative subsea boosting module for use in the system shown in FIG. 1.

FIG. 7 is a cross-sectional view of another alternative subsea boosting module 706 for use in system 100 (shown in FIG. 1). Subsea boosting module 706 is similar to subsea boosting module 606. Subsea boosting module 706 includes power components 716, electric motor 714, and fluid pump 712. Power components 716 include a single power converter 744. Subsea boosting module 706 does not include a separate transformer 226. Rather, power converter 744 may be an isolated power converter and/or electric motor 714 may have electric insulation suitable for use without a transformer.

Figure 8:
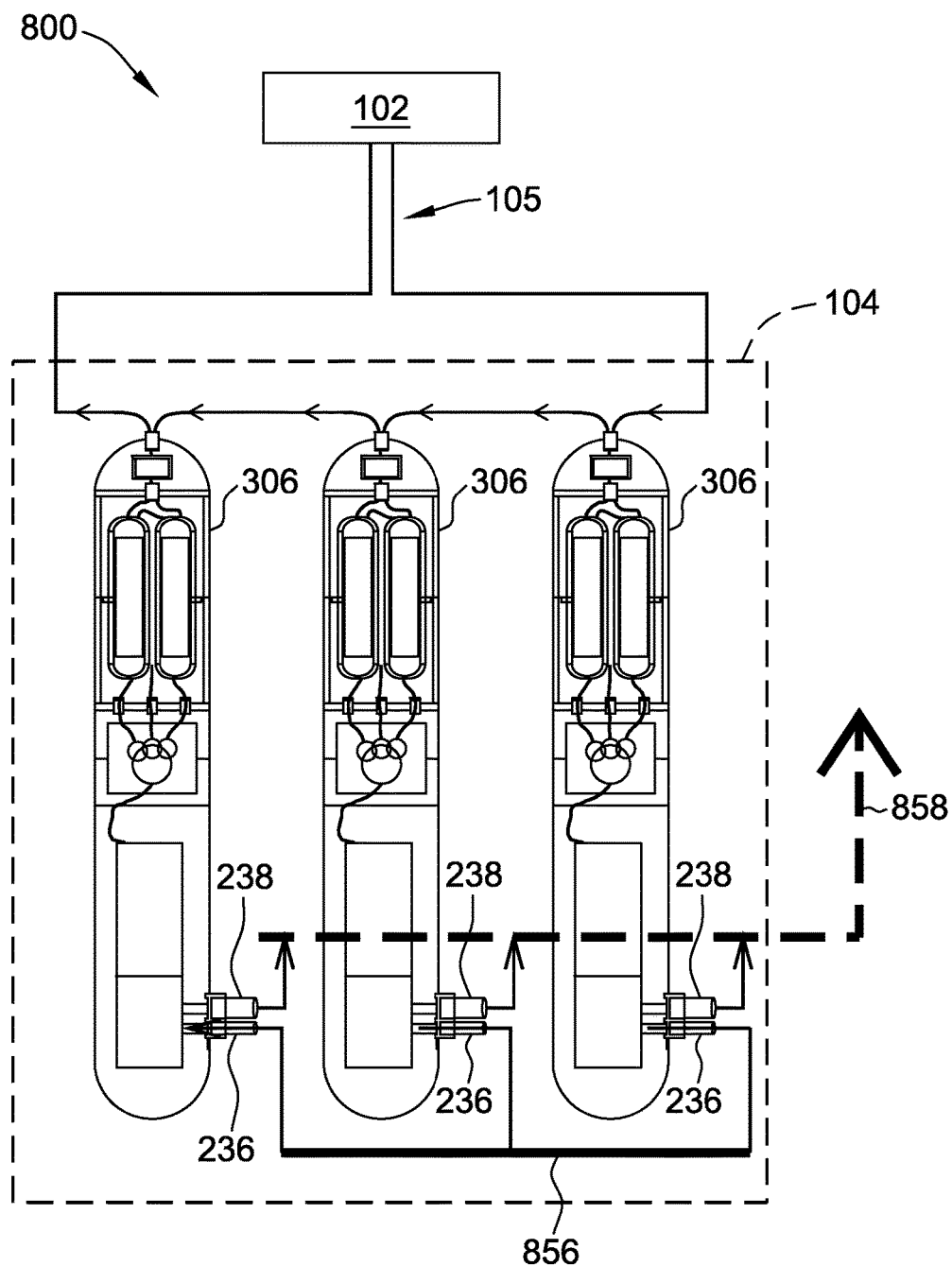
FIG. 8 is a diagram of a subsea boosting system including an assembly of three of the subsea boosting modules shown in FIG. 3.

FIG. 8 is a diagram of an exemplary subsea boosting system 800 including an assembly 104 of three subsea boosting modules 306 (shown in FIG. 3). In other embodiments, assembly 104 may be formed from subsea boosting modules 206, 406, 506, 606, and/or 706. Subsea boosting modules 306 are electrically connected in series and are connected in parallel fluid communication. The parallel fluid input is shown by input flows 856 and the parallel fluid output is shown by output flows 858.

Figure 9:
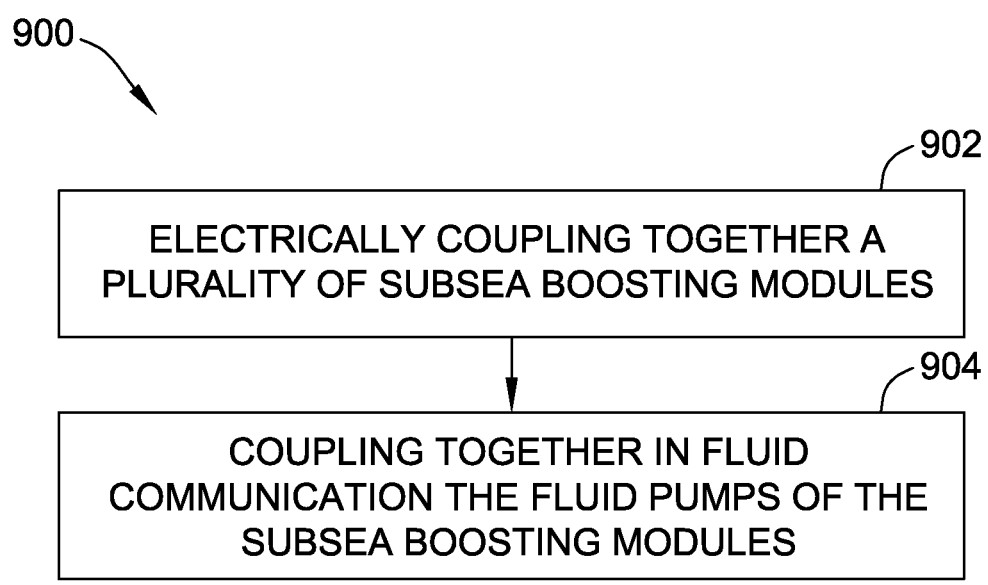
FIG. 9 is a block diagram of a method of producing a subsea boosting system for use with a DC power system.

FIG. 9 is a block diagram of a method 900 of producing a subsea boosting system for use with a DC power system, such as system 100 or 700. Method 900 may be used to produce a subsea boosting system with a first power rating. The method includes electrically coupling 902 together a plurality of subsea boosting modules (such as subsea boosting modules 106, 206, 306, 406, 506, or 606). Each subsea modules has a second power rating that is less than the first power rating. Each boosting module includes a fluid pump, an electric motor, and a plurality of power components. At 904, the fluid pumps of the subsea boosting modules are coupled together in fluid communication with each other. Accordingly, a large boosting assembly with a first power rating is created from a plurality of smaller, lower power rated modules.

Exemplary embodiments of the systems and methods are described above in detail. The systems and methods are not limited to the specific embodiments described herein, but rather, components of the systems and/or steps of the methods may be utilized independently and separately from other components and/or steps described herein. For example, the system may also be used in combination with other apparatus, systems, and methods, and is not limited to practice with only the system as described herein. Rather, the exemplary embodiment can be implemented and utilized in connection with many other applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A subsea boosting module for use with a direct current (DC) power system, said subsea boosting module comprising:
    a housing defining at least a first, a second, and a third chamber separated by a plurality of dividers, wherein said first chamber and said third chamber are configured to maintain a first pressure therein that is substantially the same as an ambient pressure outside of said housing, and wherein said second chamber is configured to maintain a substantially constant second pressure of one atmosphere therein regardless of the ambient pressure;
    a fluid pump disposed within said first chamber;
    an electric motor disposed within said first chamber, said electric motor drivingly coupled to said fluid pump;
    a plurality of power components disposed within said second chamber and comprising at least one power converter coupled to said electric motor, said plurality of power components configured to deliver power to said electric motor; and
    a bypass module disposed within said third chamber, said bypass module configured for selective electrical bypassing of said subsea boosting module.

2. The subsea boosting module in accordance with claim 1, wherein said at least one power converter is a DC to alternating current (AC) power converter.

3. The subsea boosting module in accordance with claim 1, further comprising a cooling system configured to cool at least one component of said plurality of power components, said cooling system including a cooling pump driven by said electric motor.

4. The subsea boosting module in accordance with claim 1, wherein said plurality of power components comprises at least one transformer configured to isolate a DC side of said subsea boosting module from an AC side of said subsea boosting module.

5. A subsea boosting system for use with a direct current (DC) power system, said subsea boosting system comprising:
    a plurality of subsea boosting modules, each subsea boosting module comprising:
        a housing defining at least a first, a second, and a third chamber separated by a plurality of dividers, wherein said first chamber and said third chamber are configured to maintain a first pressure therein that is substantially the same as an ambient pressure outside of said housing, and wherein said second chamber is configured to maintain a substantially constant second pressure of one atmosphere therein regardless of the ambient pressure;
        a fluid pump disposed within said first chamber;
        an electric motor disposed within said first chamber, said electric motor drivingly coupled to said fluid pump;
        a plurality of power components disposed within said second chamber and comprising at least one power converter coupled to said electric motor, said plurality of power components configured to deliver power to said electric motor; and
        a bypass module disposed within said third chamber, wherein said plurality of subsea boosting modules are electrically coupled together in series, wherein said bypass module is configured for selective electrical bypassing of its associated subsea module from said series electrical coupling between said plurality of subsea boosting modules, and wherein each said fluid pump is coupled in fluid communication to at least one other said fluid pump.

6. The subsea system in accordance with claim 5, wherein said fluid pumps of said plurality of subsea boosting modules are coupled together in parallel fluid communication.

7. The subsea system in accordance with claim 5, wherein said fluid pumps of said plurality of subsea boosting modules are coupled together in series fluid communication.

8. The subsea system in accordance with claim 7, wherein said fluid pumps of said plurality of subsea boosting modules are coupled together in series fluid communication through a plurality of fluid bypass valves each configured for selective bypassing of one of said subsea modules.

9. The subsea system in accordance with claim 5, wherein said plurality of power components of each subsea boosting module comprises a direct current (DC) to alternating current (AC) power converter configured to receive DC power and provide AC power to said associated electric motor.

10. A method of producing a subsea boosting system for use with a direct current (DC) power system, the subsea boosting system having a first power rating, said method comprising:

electrically coupling together a plurality of subsea boosting modules, each subsea boosting module of the plurality of subsea boosting modules including:

a housing defining at least a first, a second, and a third chamber separated by a plurality of dividers, wherein the first chamber and the third chamber are configured to maintain a first pressure therein that is substantially the same as an ambient pressure outside of the housing, and wherein the second chamber is configured to maintain a substantially constant second pressure of one atmosphere therein regardless of the ambient pressure;

a fluid pump disposed within said first chamber;

an electric motor disposed within said first chamber, the electric motor drivingly coupled to the fluid pump;

a plurality of power components disposed within the second chamber and including at least one power converter coupled to the electric motor, the plurality of power components configured to deliver power to the electric motor, each of the subsea boosting modules having a second power rating less than the first power rating; and a bypass module disposed within the third chamber, the bypass module configured for selective electrical bypassing of the subsea boosting module; and coupling together in fluid communication each fluid pump of the plurality of fluid pumps.

11. The method in accordance with claim 10, wherein electrically coupling together a plurality of subsea boosting modules comprises electrically coupling together a plurality of subsea boosting modules in series through the bypass module in each subsea boosting module.

12. The method in accordance with claim 10, wherein coupling together in fluid communication the fluid pumps of the subsea boosting modules comprises coupling the fluid pumps together in parallel fluid communication.

13. The method in accordance with claim 10, wherein coupling together in fluid communication the fluid pumps of the subsea boosting modules comprises coupling the fluid pumps together in series fluid communication through at least one bypass valve.

14. The method in accordance with claim 10, further comprising mechanically coupling together the plurality of subsea boosting modules into an assembly of subsea boosting modules.

* * * * *